(12) United States Patent
Brennan et al.

(10) Patent No.: US 6,600,208 B2
(45) Date of Patent: Jul. 29, 2003

(54) VERSATILE SYSTEM FOR INTEGRATED CIRCUIT CONTAINING SHIELDED INDUCTOR

(75) Inventors: Kenneth D. Brennan, Flower Mound, TX (US); Douglas A. Prinslow, McKinney, TX (US); David B. Aldrich, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 43 days.

(21) Appl. No.: 09/953,515

(22) Filed: Sep. 10, 2001

(65) Prior Publication Data

US 2002/0096736 A1 Jul. 25, 2002

Related U.S. Application Data

(60) Provisional application No. 60/231,789, filed on Sep. 11, 2000.

(51) Int. Cl.[7] .............................................. H01L 29/00
(52) U.S. Cl. ...................................................... 257/531
(58) Field of Search .................................. 257/531, 528; 438/329, 381, 622; 336/200, 84 C, 84 M

(56) References Cited

U.S. PATENT DOCUMENTS

| | | | | | |
|---|---|---|---|---|---|
| 5,760,456 | A | * | 6/1998 | Grzegorek et al. | 257/531 |
| 5,959,522 | A | * | 9/1999 | Andrews | 336/200 |
| 6,310,387 | B1 | * | 10/2001 | Seefeldt et al. | 257/531 |
| 2001/0045616 | A1 | * | 11/2001 | Yoshitomi | 257/531 |

* cited by examiner

*Primary Examiner*—Shouxiang Hu
(74) *Attorney, Agent, or Firm*—Carlton H. Hoel; W. James Brady; Frederick J. Telecky, Jr.

(57) ABSTRACT

A versatile system for reducing electromagnetic interference resulting from an inductor (300) formed within an integrated circuit is disclosed, including an inductor layer (310) having conductive elements (326) about its perimeter, first (306) and second (308) isolation layers disposed upon on opposite sides of the inductor layer and having conductive elements (326) about their perimeters, and first (302) and second (304) shield layers surrounding the first and second isolation layers, respectively, and coupled together by the conductive elements (326) of the isolation and inductor layers.

18 Claims, 4 Drawing Sheets

VERSATILE SYSTEM FOR INTEGRATED CIRCUIT CONTAINING SHIELDED INDUCTOR

This application claims the benefit of Provisional application Ser. No. 60/231,789, filed Sep. 11, 2000.

TECHNICAL FIELD OF THE INVENTION

This invention relates, in general, to tuned integrated circuits and, in particular, to integrating an inductor into semiconductor technologies while maintaining a high quality factor and minimizing electromagnetic interference.

BACKGROUND OF THE INVENTION

Since the development of tuned circuits, various types of energies such as electricity, light, and electromagnetism have been used to transmit various forms of stimuli, improving the quality of every day life. The stimuli transmitted from tuned circuits may be in the form of sound, e.g. phones and stereos, or in the form of light, e.g. television and data via a computer monitor. Such elements have enabled businesses as well as families to communicate with other counterparts across the globe conveniently and virtually without delay, resulting in closer bonds.

Tuned circuits have recently been introduced to semiconductor integration technologies. Though semiconductor technology has advanced in virtually every possible way, there is still difficulty when implementing tuned circuit technology. It has been very difficult to integrate large tuned circuit elements without sacrificing frequency extraction capabilities or quality factor ("Q-factor").

An important tuned circuit element making the previously mentioned systems possible is the inductor. Inductors can have a respectively low frequency response, thus they can be utilized for low frequency extraction or limiting, depending on the configuration. Using inductors along with other circuit components make it possible to receive, extract, process, manipulate, and transmit information in the form of energies coving a broad spectrum of frequencies.

Recently, on-chip inductors have been introduced to the semiconductor fabrication process for integration. This process has experience some difficulties. Inductors are essentially a coil of wire or some electrically conductive material. Generally, as the size shrinks, so does their inherent inductance quality factor. Therefore, integrated inductors have respectively low inductances.

Including inductors in semiconductor technologies is also difficult due to the electromagnetic interference generated therein. The fields generated by one circuit element tends to interfere with the signals within other adjacent circuit elements. Additionally, inductors in semiconductor technology tend to couple fields to the substrate inducing Eddy currents within the substrate.

SUMMARY OF THE INVENTION

Therefore, a versatile system for utilizing inductors within an integrated circuit ("IC") without sacrificing the quality of adjacent circuit elements or coupling fields of the inductor to the substrate is now needed; providing cost-effective and efficient performance while overcoming the aforementioned limitations of conventional methods.

The present invention provides an integrated circuit comprising a first isolation layer having an inner and an outer surface, a second isolation layer having an inner and an outer surface, an inductor disposed between the inner surfaces of the first and second isolation layers, a first shield layer disposed upon the outer surface of the first isolation layer, and a second shield layer disposed upon the outer surface of the second isolation layer and adapted to couple to the first shield layer about an outer perimeter of the first and second isolation layers.

The present invention also provides a device for reducing electromagnetic interference within an integrated circuit having an inductor, comprising an inductor layer having conductive elements about its perimeter, first and second isolation layers disposed upon on opposite sides of the inductor layer and having conductive elements about their perimeters, and first and second shield layers surrounding the first and second isolation layers, respectively, and coupled together by the conductive elements of the isolation and inductor layers.

The present invention further provides a method of shielding electromagnetic interference of an inductor within a semiconductor component, comprising the steps of providing an inductor, providing first and second isolation layers disposed upon on opposite sides of the inductor, having conductive elements about their perimeters, and providing first and second shield layers surrounding the first and second isolation layers, respectively, and coupled together by the conductive elements of the isolation layers.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and the use of the present invention is discussed in detail below, it should be appreciated that the present invention provides many applicable inventive concepts which can be embodied in a wide variety of specific contexts. The specific embodiments discussed herein are merely illustrative of specific ways to make and use the invention, do not delimit the scope of the invention.

Figure 1:
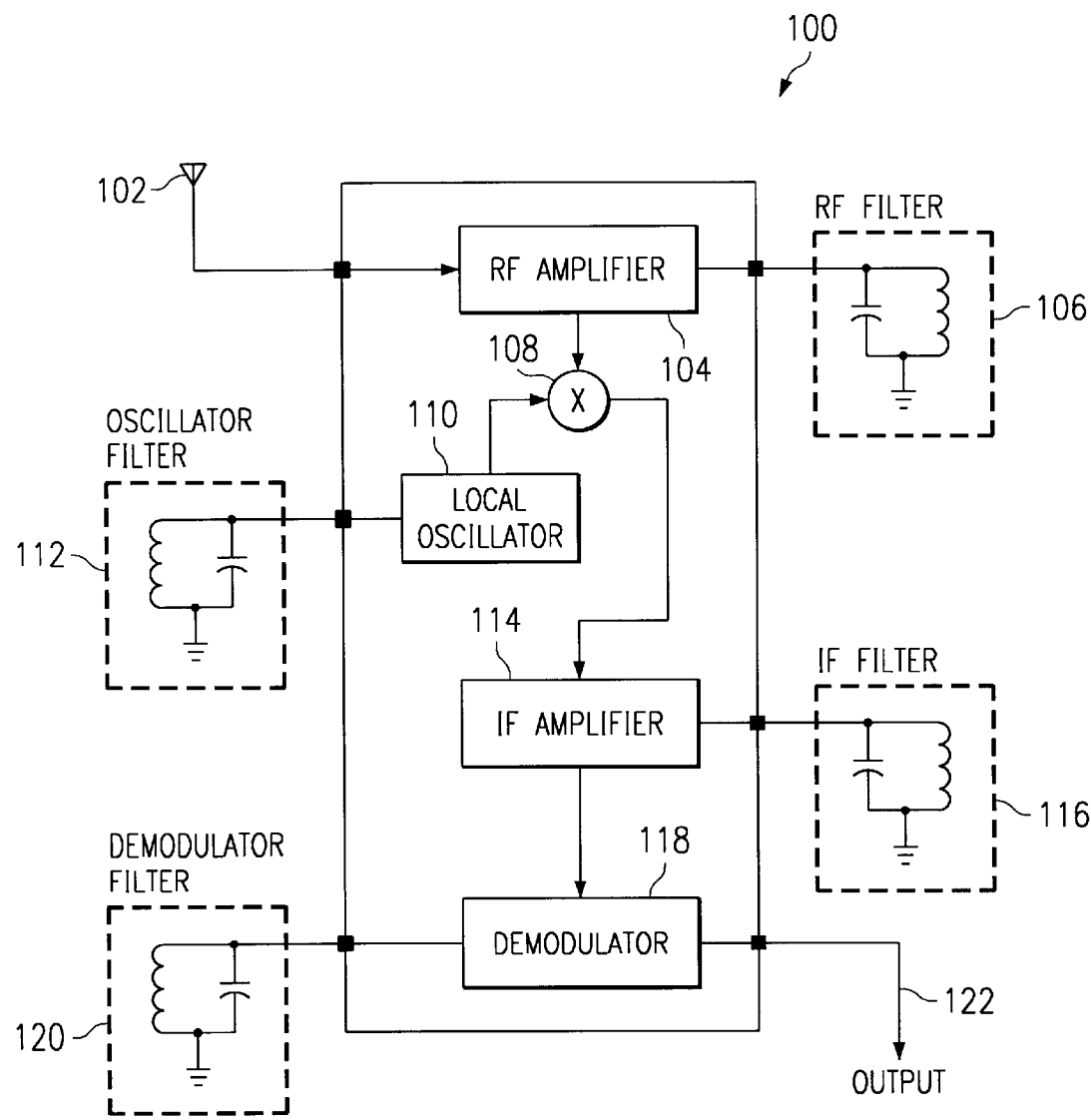
FIG. 1 depicts a prior art receiver system using off chip filters.

Referring now to FIG. 1, a prior art telecommunication system is depicted. System 100 is a block diagram of the major components of a super-heterodyne receiver, a basic example of a modern day telecommunication system utilizing integrated circuits (ICs) and off-chip components. System 100 has an antenna 102 which captures a communications signal and transfers it to a radio frequency ("RF") amplifier 104 which amplifies the incoming signal, while filtering it via the off-chip RF filter 106. The now filtered and amplified signal is conducted through a multiplier (or mixer) 108, where it is 'mixed' with a second signal coming from the local oscillator 110. The input signal of local oscillator 110 to multiplier 108 is directly related to the value of another off-chip circuit, the oscillator filter 112. Multiplier 108 combines the two inputs, sending them through intermediate frequency ("IF") amplifier 114, and yet another off-chip filter, IF filter 116. The resultant signal is then processed by demodulator 118, which may be process the signal into a more useable form via another off-chip filter, demodulator filter 120, before transfer to output 122. Since all of the filters are off-chip, they tend to require much more power than the other circuitry. Despite the inefficiency and inconvenience, off-chip filters like filters 106, 112, 116, and 120 are necessary for the signal extraction process. Thus, these off-chip filters are generally used in all conventional telecommunications systems.

Figure 2:
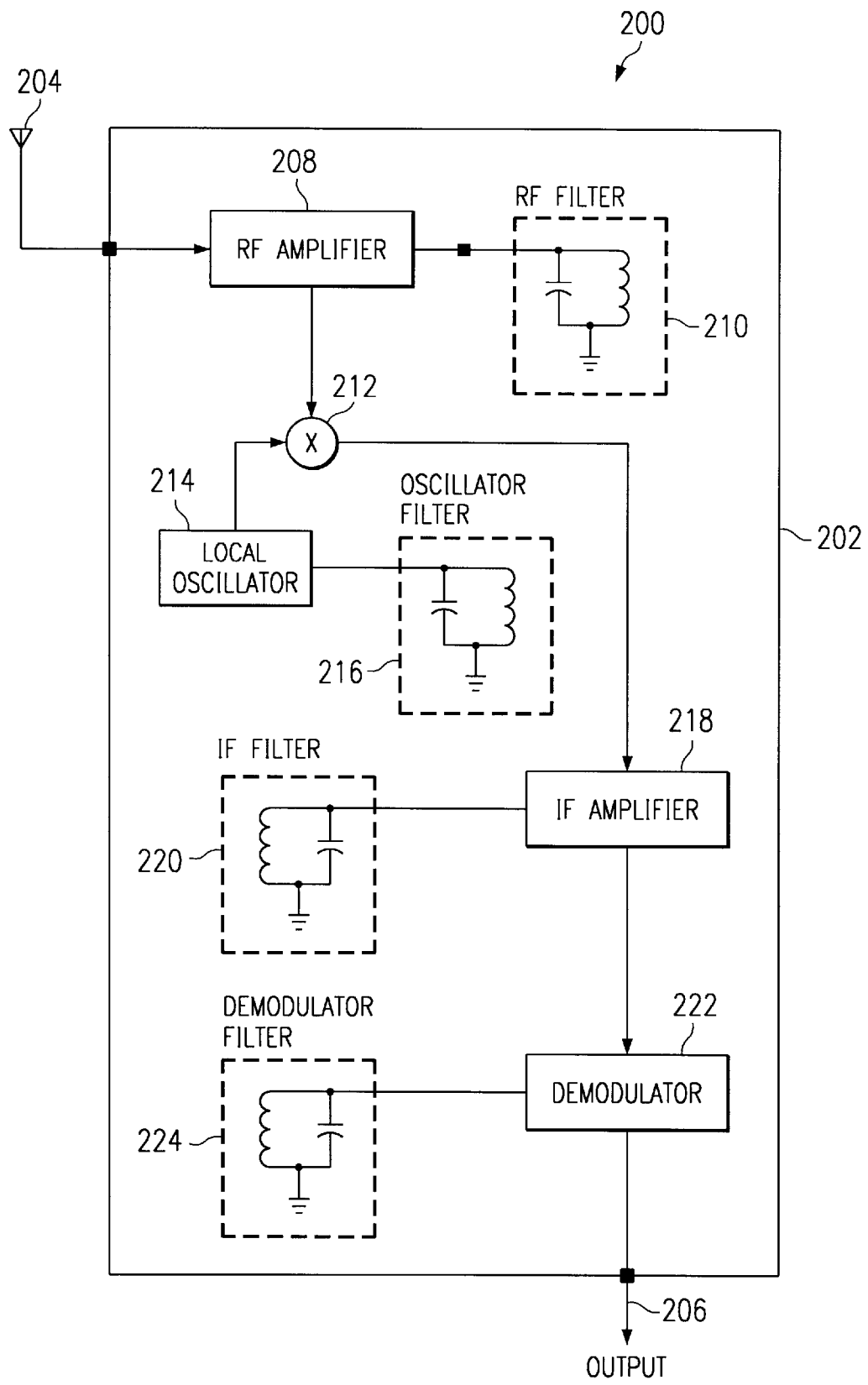
FIG. 2 is an illustrative diagram of a receiver system according to the present invention.

In contrast, FIG. 2 depicts a block diagram of the major components of a super-heterodyne receiver according to the present invention. System 200 comprises IC receiver chip 202, antenna 204, and output port 206. In system 200, all circuitry is contained within IC chip 202. Antenna 204 and output port 206 are the only external components to IC 202. RF amplifier 208 does not use an off-chip filter, instead using RF filter 210 to process the first stage of an incoming signal. A mixer 212 is contained within IC 202. Mixer 212 mixes the signal processed from the RF amplifier 208 with a second signal generated by local oscillator 214. The local oscillator=s signal is generated by a combination of on-chip filters, the oscillator filters 216. When mixer 212 combines the two signals together, the IF stage will extract and amplify the useable portion of the signal via IF amplifier 218 and on-chip IF filter 220. After the signal has gone through the IF stage of IC 202, it processes through demodulator 222 which may use various arrays of on-chip filters 224.

Figure 3:
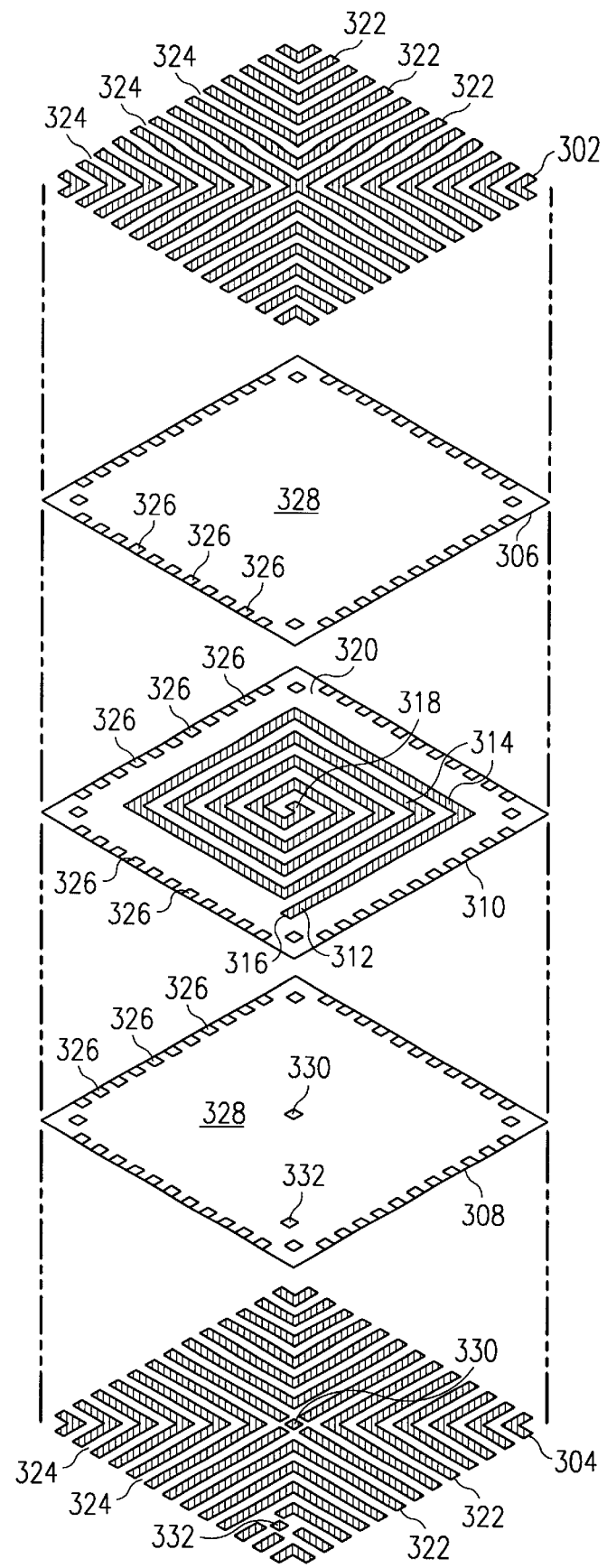
FIG. 3 is an exploded view diagram of an embodiment of the present invention.

Referring now to FIG. 3, one embodiment of a shielded inductor 300 according to the present invention is depicted in exploded view. Inductor 300 comprises an upper shielding member 302 and a lower shielding member 304, an upper isolation member 306 and a lower isolation member 308, and a planar inductor member 310. As depicted, each member comprises a separate layer of inductor 300, although other topologies are contemplated depending upon design and process variations. Planar inductor layer 310 is interposed between isolation layers 306 and 308.

A planar inductor 312 is disposed upon layer 310 in the form of a spiral. The shape of the spiral may be formed to be substantially rectangular, as depicted, or may be formed to be a helix or any suitable polygonal shape. One potential advantage to use of a rectangular spiral is that the conductive traces 314 of inductor 312 to be patterned and etched easily without the difficulties experienced trying to pattern a curvilinear trace. Also, a rectangular spiral allows inductor 312 to occupy a normalized amount of real estate within an IC. The traces 314 comprise of an electrically conductive material such as copper, aluminum or any combination thereof. The length, width, spacing and the depth of the conductive traces 314 determine the inductance of inductor 312, and may be varied depending upon desired current and frequency operation. At either the outer end 316 or the inner end 318 of inductor 312, a via may be coupled thereto for electrical connectivity. The area 320 surrounding inductor 312 comprises an electrically insulating material, as long as the adjacent conductive traces 314 are electrically isolated from one another.

Upper and lower shielding layers 302 and 304 combine to form a "cage" about the outer perimeter of inductor 300. Layers 302 and 304 comprise electrically conductive material (e.g., aluminum, copper or a combination thereof). The electrically conductive nature of layers 302 and 304 results in a cage having low resistivity. The advantage to having cage members possessing a low resistivity is their ability to absorb much of the electromagnetic interference generated by inductor 312. The conductive traces 322 of members 302 and 304 are evenly spaced and formed in specific relation to those of planar inductor layer 310. The area occupying the spaces 324 between conductive traces 322 comprises an electrically insulating material, or possibly a substrate-type material, as long as the adjacent conductive traces 322 are electrically isolated from one another. Members 320 and 304 may be coupled to an electrical ground. The electrical ground provides an area to essentially neutralize extra currents. Member 302 blocks transmission of electromagnetic interference to any layers above it. In addition, member 302 provides a shield from any incoming electromagnetic interference from an outside source. Member 304 blocks transmission of electromagnetic interference to any layers below it. Additionally, member 304 provides a shield from any incoming electromagnetic interference from any outside sources.

The patterning or formation of each conductive trace 322 is orthogonal (i.e. not parallel) to the conductive traces 314 of inductor 312. This pattering of members 302 and 304 minimizes Eddy currents flowing within their conductive traces. The substantial absorption of the electromagnetic interference via the cage decouples the inductor 300 from the substrate, as well as decoupling the inductor 300 from adjacent inductors.

Insulating layer 306 is disposed between layers 302 and 310, and insulating layer 308 is disposed between layers 310 and 304. Insulating layers 306 and 308 may comprise any suitable non-conductive material, and may even comprise an air gap. Looking along the perimeter of the insulating layers 306 and 308, the location of vias 326 can be seen. The vias 326 may comprise part of the insulating layers 306 and 308, as well part of inductor layer 310. Vias 326 provide an electrical connection from the member 302 to member 304. The vias 326, having their location along the perimeter of layers 306, 308, and 310 joins the conductive traces 322 of members 302 and 304, essentially enclosing inductor 312 within a cage. Vias 326, being part of the cage enclosure, provide a substantial shield to interference that may transmit laterally through the side of inductor layer 310. Again, insulating layers 306 and 308 mostly comprise an electrically insulating material, or possibly a substrate-type material 328, as long as the adjacent vias 326 are electrically isolated from one another.

Disposed within insulation layer 308 are two extra vias 330 and 332. Vias 330 and 332 may be utilized for electrical connection to external devices or circuitry. The specific location of vias 330 and 332 are shown for illustration purposes only, and may be varied depending upon particular design requirements in accordance with the present invention.

Figure 4:
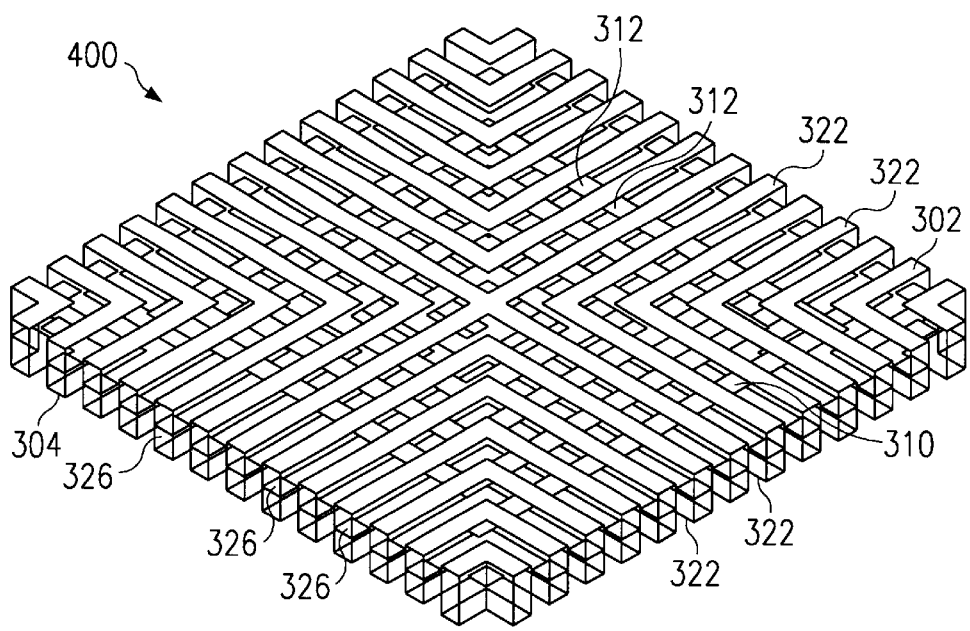
FIG. 4 provides another illustration of the present invention.

Referring now to FIG. 4, a perspective view of a caged inductor 400 is depicted. In this figure, for purposes of illustration, insulation layers have been omitted in order to illustrate how inductor 312 is enclosed within an actual shielding "cage". In FIG. 4, inductor 312 and the electrically conductive vias 326 lining its perimeter are shaded in. On either side of inductor layer 310 are cage layers 302 and 304. Vias 326 of layer 310 line up with conductive traces 322 of cage members 302 and 304. Thus, the present invention provides a true orthogonally patterned shield cage.

Figure 5:
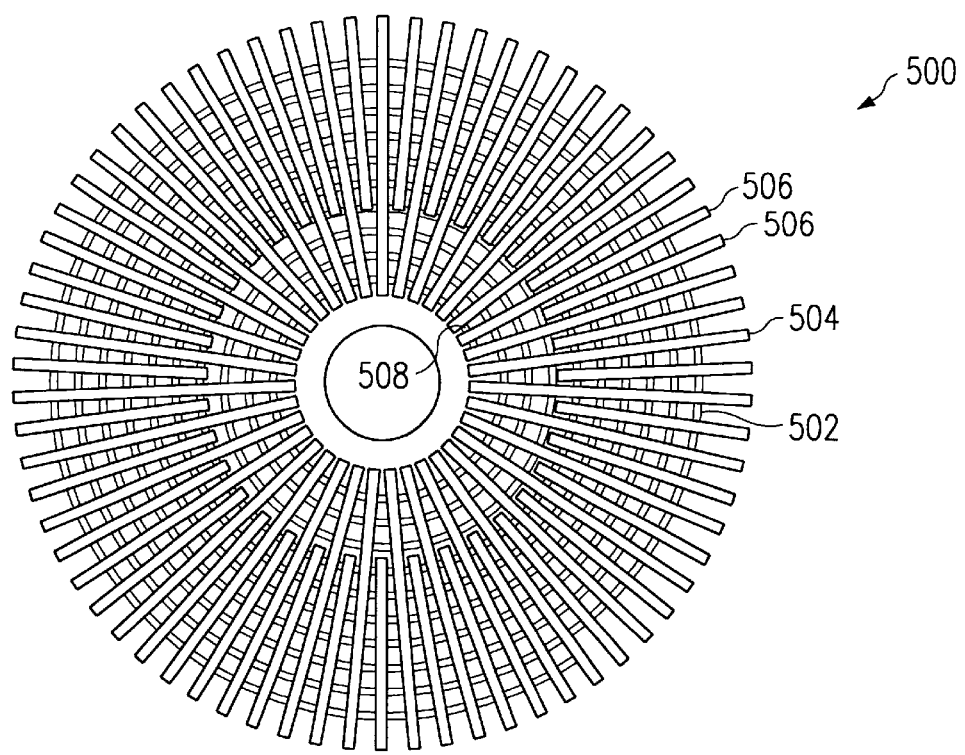
FIG. 5 depicts another embodiment of the present invention.

Referring now to FIG. 5, a plan view of an inductor 500 is illustrated. Inductor 500 comprises a planar inductor 502, having a helical shape, and an orthogonal shield cage 504. Comparing inductor 500 with inductor 300 from FIG. 3, inductor 502 is depicted with a different shape in order to illustrate that the orthogonal shield members 506 may be formed to enclose inductor 502. As before, the width and spacing of the traces 506 of the cage member layers 504 are still proportional to that of the conductive traces 508 of inductor 502. As noted in reference to FIG. 4, inductor 500 is shown without insulation layers disposed between traces 506 and 508, in order to more simply illustrate this possible configuration.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. The teachings and concepts of the present invention may be applied to a variety of semiconductor devices and circuitry applications. The principles of the present invention are practicable in a number of technologies. It is therefore intended that the appended claims encompass any such modifications or embodiments.

What is claimed is:

1. An integrated circuit comprising:
   a first isolation layer having an inner surface and an outer surface;
   a second isolation layer having an inner surface and an outer surface;
   an inductor disposed between the inner surfaces of the first and second isolation layers;
   a first shield layer having a first group of mutually electrically isolated conductive traces disposed upon the outer surface of the first isolation layer; and
   a second shield layer having a second group of mutually electrically isolated conductive traces disposed upon the outer surface of the second isolation layer, wherein said first group of mutually electrically isolated conductive traces are connected to said second group of mutually electrically isolated conductive traces through conductive elements distributed along an outer perimeter of the first isolation layer and an outer perimeter of the second isolation layer.

2. The integrated circuit of claim 1 wherein the inductor is a spiral inductor.

3. The integrated circuit of claim 2 wherein the inductor is a square spiral inductor.

4. The integrated circuit of claim 2 wherein the inductor is a helical spiral inductor.

5. The integrated circuit of claim 1 wherein the inductor is formed of aluminum.

6. The integrated circuit of claim 1 wherein the isolation layers are formed of a semiconductor material.

7. The integrated circuit of claim 1 wherein the isolation layers are formed of air.

8. The integrated circuit of claim 1 wherein the shield layers are formed of a material having low resistivity.

9. The integrated circuit of claim 8 wherein the shield layers are formed of aluminum.

10. The integrated circuit of claim 8 wherein the shield layers are formed of copper.

11. The integrated circuit of claim 1 wherein the conductive traces in said first and second shield layers are formed orthogonal to the flow of Eddy currents induced therein by the inductor.

12. The integrated circuit of claim 1 further comprising vias distributed along each of the outer perimeters of the first and second isolation layers, wherein said vias are filled with said conductive elements.

13. A device for reducing electromagnetic interference within an integrated circuit having an inductor, comprising:
    an inductor layer having said inductor;
    a first and a second isolation layers disposed upon on opposite sides of the inductor layer;
    a first and a second shield layers each having a plurality of mutually electrically isolated conductive traces, wherein the first and second isolation layers and the inductor layer are sandwiched between said first and second shield layers; and
    conductive elements distributed along perimeters of the inductor layer and the first and second isolation layers, wherein the conductive traces of the first shield layer are connected to the conductive traces of the second shield layer through said conductive elements.

14. The device of claim 13 wherein the inductor comprises a spiral inductor.

15. The device of claim 13 wherein the inductor comprises a polygonal inductor.

16. The device of claim 13 wherein the isolation layers comprise a semiconductor material.

17. The device of claim 13 wherein the shield layers comprise a low resistivity material.

18. The device of claim 13 wherein the conductive traces of the first and second shield layers are formed orthogonal to the flow of Eddy current induced therein by the inductor.

* * * * *